United States Patent
Furuta et al.

(10) Patent No.: US 8,199,582 B2
(45) Date of Patent: *Jun. 12, 2012

(54) NAND-TYPE FLASH MEMORY AND NAND-TYPE FLASH MEMORY CONTROLLING METHOD

(75) Inventors: Yuka Furuta, Yokohama (JP); Yoshihisa Watanabe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/043,624

(22) Filed: Mar. 9, 2011

(65) Prior Publication Data

US 2011/0157994 A1 Jun. 30, 2011

Related U.S. Application Data

(63) Continuation of application No. 12/544,284, filed on Aug. 20, 2009, now Pat. No. 7,924,621.

(30) Foreign Application Priority Data

Sep. 17, 2008 (JP) .................................. 2008-238092

(51) Int. Cl.
*G11C 16/04* (2006.01)

(52) U.S. Cl. ......... 365/185.18; 365/185.17; 365/189.05; 365/189.07

(58) Field of Classification Search ............. 365/185.17, 365/185.18, 185.21, 185.05, 185.07, 185.33
See application file for complete search history.

(56) References Cited

U.S. PATENT DOCUMENTS

| 5,890,005 | A | 3/1999 | Lindholm | |
|---|---|---|---|---|
| 6,877,050 | B2 | 4/2005 | Kanzaki et al. | |
| 7,170,812 | B2 | 1/2007 | Nii | |
| 7,227,782 | B2 * | 6/2007 | Lee et al. | 365/185.17 |
| 7,616,498 | B2 * | 11/2009 | Mokhlesi et al. | 365/185.21 |
| 7,646,642 | B2 | 1/2010 | Fujito et al. | |
| 7,697,333 | B2 * | 4/2010 | Isobe | 365/185.11 |

FOREIGN PATENT DOCUMENTS

| JP | 2001-021609 | 1/2001 |
|---|---|---|
| JP | 2001-325794 | 11/2001 |
| JP | 2003-249082 | 9/2003 |
| JP | 2008-176830 | 7/2008 |
| WO | WO 01-80249 | 10/2001 |

OTHER PUBLICATIONS

Japanese Office Action with English translation dated Nov. 9, 2010 in Application No. 2008-238092, 6 pages.

* cited by examiner

*Primary Examiner* — David Lam
(74) *Attorney, Agent, or Firm* — Oblon, Spivak, McClelland, Maier & Neustadt, L.L.P.

(57) ABSTRACT

A method of controlling a NAND-type flash memory provided with a latch circuit in which data is temporarily stored has measuring a first consumption current of the latch circuit in a first state in which the latch circuit is caused to retain first logic; measuring a second consumption current of the latch circuit in a second state in which the latch circuit is caused to retain second logic obtained by inverting the first logic; and comparing the first consumption current and the second consumption current to cause the latch circuit to retain logic corresponding to the state corresponding to a smaller one of the first consumption current and the second consumption current.

11 Claims, 11 Drawing Sheets

NAND-TYPE FLASH MEMORY AND NAND-TYPE FLASH MEMORY CONTROLLING METHOD

CROSS-REFERENCE TO RELATED APPLICATION

This application is a continuation of U.S. application Ser. No. 12/544,284, filed Aug. 20, 2009 and claims the benefit of priority from the prior Japanese Patent Application No. 2008-238092, filed on Sep. 17, 2008, the entire contents of which are incorporated herein by reference.

BACKGROUND OF THE INVENTION

1. Field of the Invention

The present invention relates to a NAND-type flash memory provided with a latch circuit in which data is temporarily stored.

2. Background Art

Recently, the number of latch circuits in which data is temporarily stored has been dramatically increased with the high integration of the NAND-type flash memory (for example, see Japanese Patent Laid-Open No. 2003-249082).

Therefore, the total amount of off currents passed through transistors constituting the latch circuits is increased when the transistors are turned off. That is, there is a problem in that a consumption current of the NAND-type flash memory is increased.

SUMMARY OF THE INVENTION

According to one aspect of the present invention, there is provided: a method of controlling a NAND-type flash memory provided with a latch circuit in which data is temporarily stored, the method comprising:

measuring a first consumption current of the latch circuit in a first state in which the latch circuit is caused to retain first logic;

measuring a second consumption current of the latch circuit in a second state in which the latch circuit is caused to retain second logic obtained by inverting the first logic; and comparing the first consumption current and the second consumption current to cause the latch circuit to retain logic corresponding to the state corresponding to a smaller one of the first consumption current and the second consumption current.

According to another aspect of the present invention, there is provided: a method of controlling a NAND-type flash memory provided with a plurality of latch circuits in which data are temporarily stored, the method comprising:

measuring a first consumption current of all the plurality of latch circuits in a first state in which the plurality of latch circuits are caused to retain logic corresponding to a first data pattern;

measuring a second consumption current of all the plurality of latch circuits in a second state in which the plurality of latch circuits are caused to retain logic corresponding to a second data pattern that is different from the first data pattern; and comparing the first consumption current and the second consumption current to cause the plurality of latch circuits to retain logic corresponding to the state corresponding to a smaller one of the first consumption current and the second consumption current.

According to still another aspect of the present invention, there is provided: a method of controlling a NAND-type flash memory provided with a plurality of latch circuits in which data are temporarily stored, the method comprising:

measuring a first consumption current of the NAND-type flash memory in a first state in which the plurality of latch circuits are caused to retain logic corresponding to a first data pattern;

measuring a second consumption current of the NAND-type flash memory in a second state in which the plurality of latch circuits are caused to retain logic corresponding to a second data pattern that is different from the first data pattern; and comparing the first consumption current and the second consumption current to cause the plurality of latch circuits to retain logic corresponding to the state corresponding to a smaller one of the first consumption current and the second consumption current.

According to still another aspect of the present invention, there is provided: a NAND-type flash memory provided with a plurality of latch circuits, comprising:

a memory cell array in which memory cells are arrayed in a matrix state, data being electrically rewritable in the memory cell;

a bit line control circuit that includes the plurality of latch circuits, the latch circuit being connected to the memory cell through a bit line, the latch circuits temporarily retaining data; and a nonvolatile memory, wherein a first consumption current of all the plurality of latch circuits is measured in a first state in which the plurality of latch circuits are caused to retain logic corresponding to a first data pattern, a second consumption current of all the plurality of latch circuits is measured in a second state in which the plurality of latch circuits are caused to retain logic corresponding to a second data pattern that is different from the first data pattern, after the first consumption current and the second consumption current are compared, information corresponding to the data pattern corresponding to a smaller one of the first consumption current and the second consumption current is stored in the nonvolatile memory, and the information is read from the nonvolatile semiconductor memory, and logic corresponding to the data pattern corresponding to the information are retained in the plurality of latch circuits.

According to still another aspect of the present invention, there is provided: a NAND-type flash memory provided with a plurality of latch circuits, comprising:

a memory cell array in which memory cells are arrayed in a matrix state, data being electrically rewritable in the memory cell;

a bit line control circuit that includes the plurality of latch circuits, the latch circuit being connected to the memory cell through a bit line, the latch circuits temporarily retaining data; and a nonvolatile memory, wherein a first consumption current of the NAND-type flash memory is measured in a first state in which the plurality of latch circuits are caused to retain logic corresponding to a first data pattern, a second consumption current of the NAND-type flash memory is measured in a second state in which the plurality of latch circuits are caused to retain logic corresponding to a second data pattern that is different from the first data pattern, after the first consumption current and the second consumption current are compared, information corresponding to the data pattern corresponding to a smaller one of the first consumption current and the second consumption current is stored in the nonvolatile memory, and the information is read from the nonvolatile semiconductor memory, and logic corresponding to the data pattern corresponding to the information are retained in the plurality of latch circuits.

DETAILED DESCRIPTION

Embodiments according to the present invention will be described below with reference to the drawings.

(First Embodiment)

Figure 1:
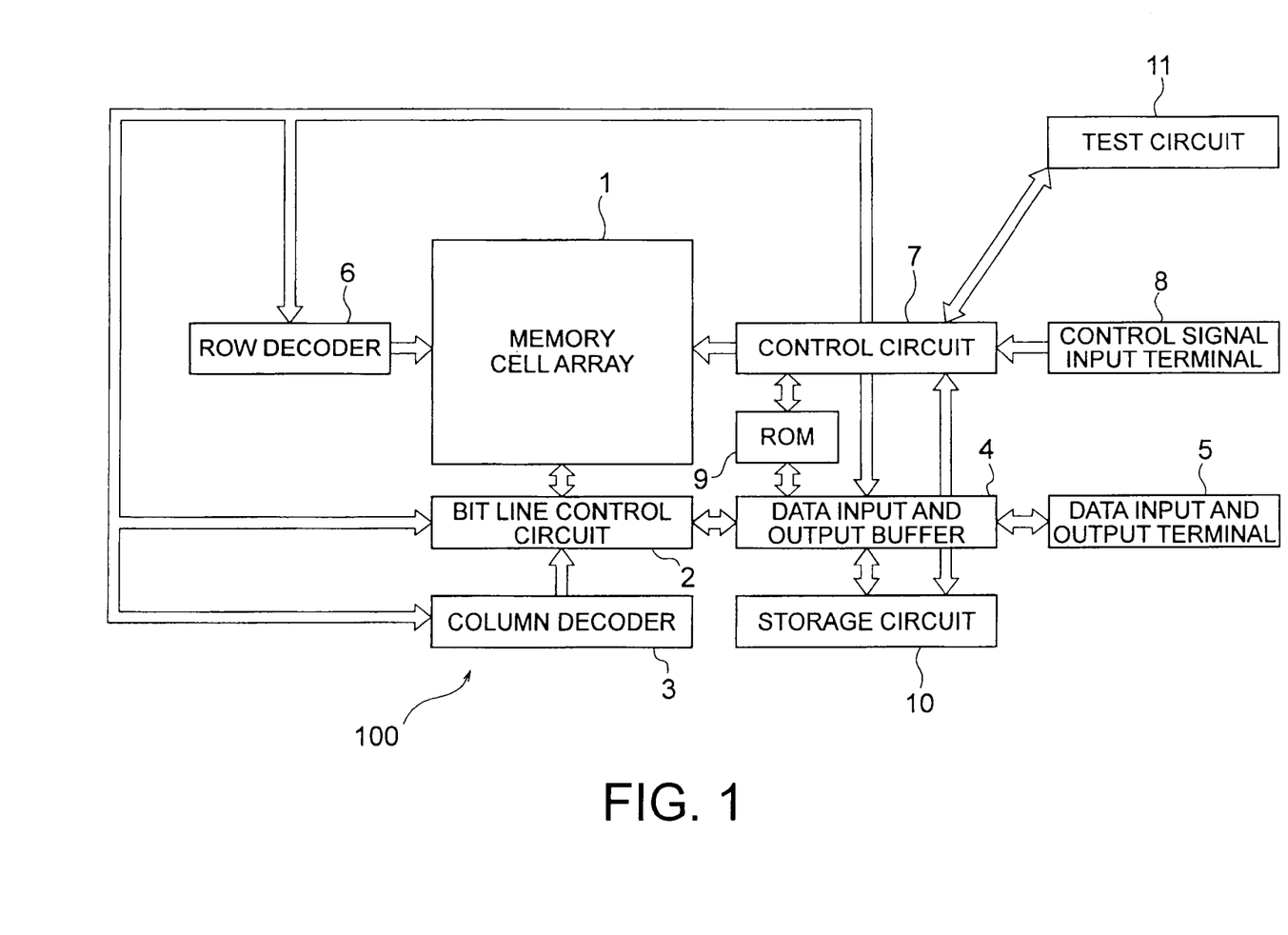
FIG. 1 is a block diagram illustrating an example of a configuration of a NAND-type flash memory 100 according to a first embodiment of the invention.

FIG. 1 is a block diagram illustrating an example of a configuration of a NAND-type flash memory 100 according to a first embodiment of the invention.

Referring to FIG. 1, the NAND-type flash memory 100 includes a memory cell array 1, a bit line control circuit 2, a column decoder 3, a data input and output buffer 4, a data input and output terminal 5, a row decoder 6, a control circuit 7, a control signal input terminal 8, ROM (Read Only Memory) 9, and a storage circuit 10.

The memory cell array 1 includes plural bit lines, plural word lines, and a common source line. In the memory cell array 1, memory cells are arrayed in a matrix state. For example, the memory cell includes an EEPROM cell in which data is electrically rewritable.

The memory cell array 1 is connected to a bit line control circuit 2 that controls a potential at a bit line and a row decoder 6 that controls a potential at a word line. The plural memory cells are divided into plural blocks, and one of the blocks is selected in operation.

The bit line control circuit 2 includes a sense latch circuit that acts as both a sense amplifier and a data latch circuit. The sense amplifier sense-amplifies a potential at the bit line in the memory cell array 1. The sense latch circuit latches data to be written. The bit line control circuit 2 reads the data from the memory cell in the memory cell array 1 through the bit line, detects a state of the memory cell through the bit line, and writes the data in the memory cell by applying a write control voltage to the memory cell through the bit line.

The bit line control circuit 2 is connected to the column decoder 3 and the data input and output buffer 4. The column decoder 3 selects the sense latch circuit in the bit line control circuit 2, and the data of the memory cell read by the sense latch circuit is output to the outside from the data input and output terminal 5 through the data input and output buffer 4.

Further, the write data input from the outside into the data input and output terminal 5 is stored through the data input and output buffer 4 in the sense latch circuit selected by the column decoder 3.

The row decoder 6 is connected to the memory cell array 1. The row decoder 6 applies a voltage necessary for the read, write, or erase to the word line of the memory cell array 1.

The control circuit 7 controls the memory cell array 1, the bit line control circuit 2, the column decoder 3, the data input and output buffer 4, the row decoder 6, ROM 9, and the storage circuit 10.

The control circuit 7 performs a control operation in response to a control signal input from the outside through the control signal input terminal 8. That is, the control circuit 7 generates a desired voltage in programming, verifying, reading, and erasing the data in response to the control signal, and the control circuit 7 supplies the voltage to each part of the memory cell array 1.

Information corresponding to a data pattern regulating logic of each of plural latch circuits is stored in ROM 9 that is of a nonvolatile memory. The data pattern corresponding to the information is input from ROM 9 into the bit line control circuit through the data input and output buffer 4. The logic corresponding to the data pattern is stored (retained) in the sense latch circuit selected by the column decoder 3.

Alternatively, the information may be stored in the memory cell that is of the nonvolatile memory in the memory cell array 1.

The storage circuit 10 is a circuit in which the data pattern corresponding to the logic stored (retained) in the sense latch circuit of the bit line control circuit 2 is temporarily stored in the standby state.

Alternatively, the data pattern may be stored in the memory cell that is of the nonvolatile memory in the memory cell array 1.

A test circuit 11 is provided outside the NAND-type flash memory 100. The test circuit 11 is controlled by an external circuit (not illustrated) to measure a consumption current of the latch circuit in the bit line control circuit or a consumption current of the whole of the NAND-type flash memory 100. The test circuit 11 outputs the information to the control circuit 7 according to the measurement result.

Alternatively, the test circuit 11 may be provided in the NAND-type flash memory 100.

Figure 2:
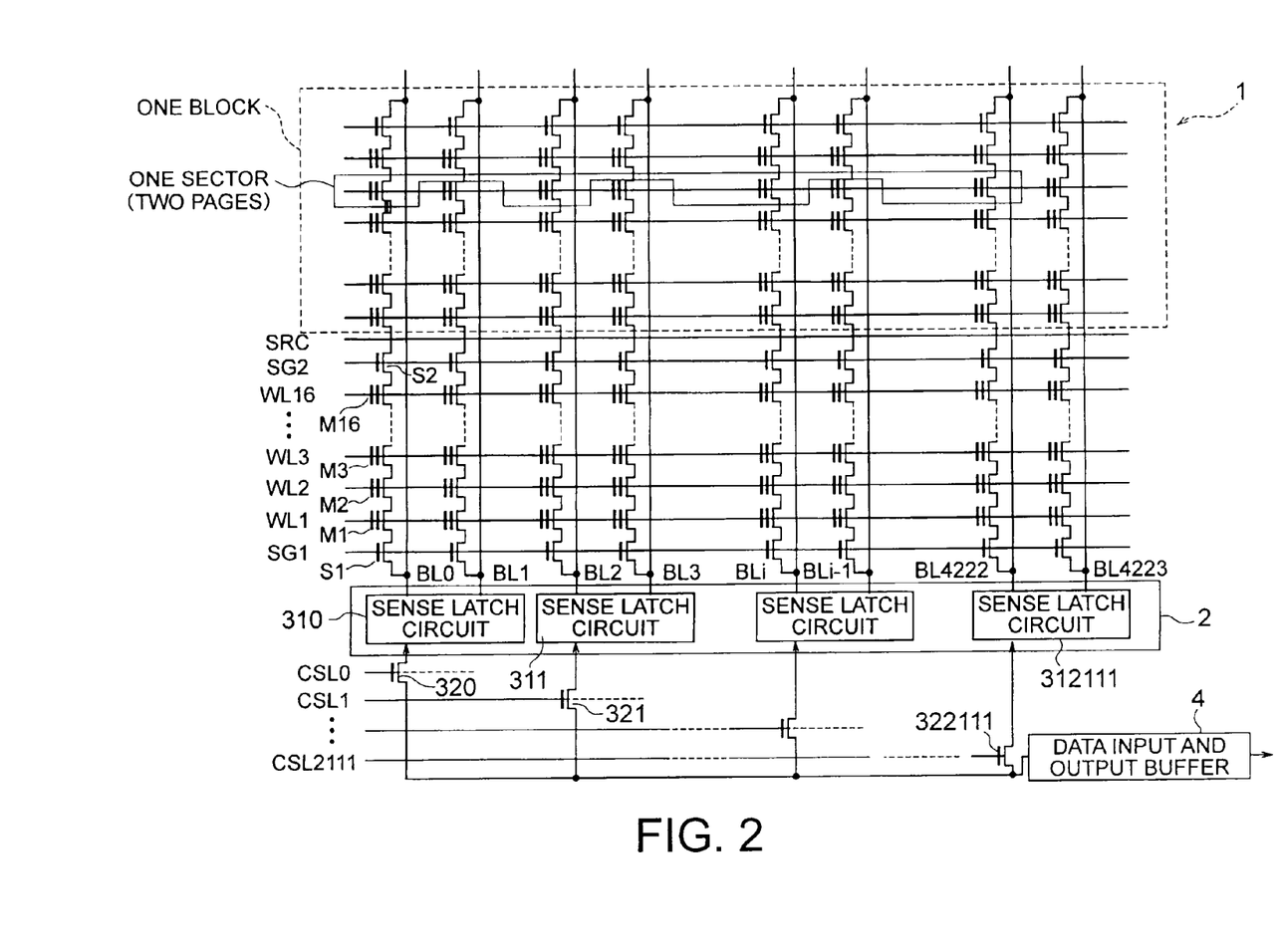
FIG. 2 is a circuit diagram illustrating the configuration including the memory cell array 1, bit line control circuit 2, data input and output buffer 4 of FIG. 1.

FIG. 2 is a circuit diagram illustrating the configuration including the memory cell array 1, bit line control circuit 2, data input and output buffer 4 of FIG. 1.

Referring to FIG. 2, the bit line control circuit 2 includes plural sense latch circuits 310, 311, ..., and 312111.

The sense latch circuits 310, 311, ..., and 312111 are connected to the data input and output buffer 4 through column select gates 320, 321, ..., and 322111. The column select gates 320, 321, ..., and 322111 are controlled by column selection signals CSL0, CSL1, ..., and CSL2111 supplied from the column decoder 3.

The pair of bit lines is connected to each of the sense latch circuits 310, 311, ..., and 312111. That is, bit lines BL0 and BL1 are connected to the sense latch circuit 310, bit lines BL2 and BL3 are connected to the sense latch circuit 311, and bit lines BL4222 and BL4223 are connected to the sense latch circuit 312111.

As illustrated in FIG. 2, as described above, plural NAND cell units are connected to the memory cell array 1.

For example, one NAND cell unit includes 16 series-connected memory cells M1, M2, M3, ..., and M16, a selection gate transistor S1 connected to the memory cell M1, and a selection gate transistor S2 connected to the memory cell M16.

The first selection gate transistor S1 is connected to the bit line BL0. The second selection gate transistor S2 is connected to a source line SRC.

Control gates of the memory cells M1, M2, M3, ..., and M16 disposed in rows are connected to word lines WL1, WL2, WL3, ..., and WL16.

Gates of the first selection gate transistors S1 are commonly connected to a select line SG1. Gates of the second selection gate transistors S2 are commonly connected to a select line SG2.

One block includes 4224 NAND cell units. The pieces of data are erased by blocks. The memory cells connected to one word line constitute one sector. The pieces of data are written and read by sectors. The two-page data is stored in one sector.

Figure 3:
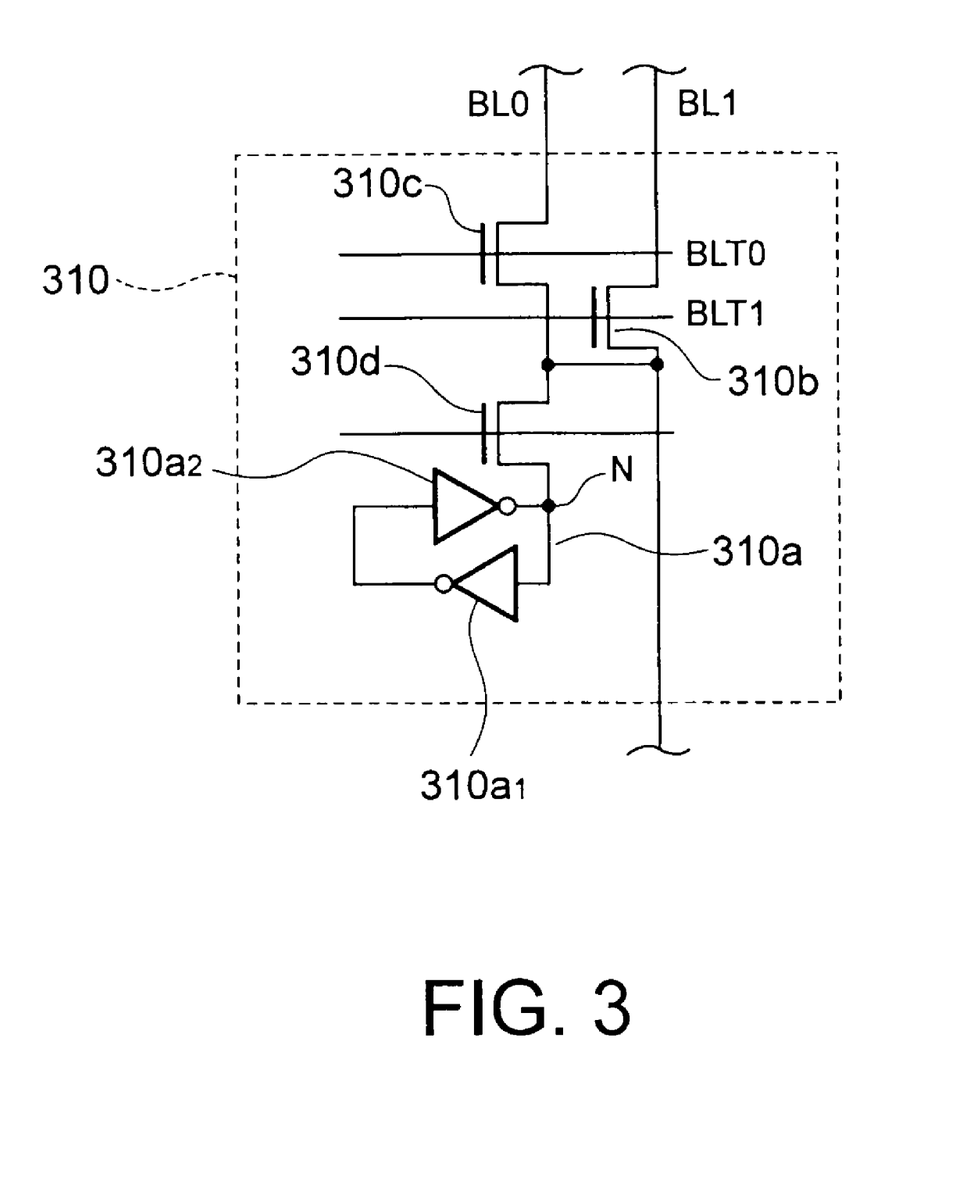
FIG. 3 is a circuit diagram illustrating an example of a configuration of the sense latch circuit 310 in the bit line control circuit 2 of FIG. 2.

FIG. 3 is a circuit diagram illustrating an example of a configuration of the sense latch circuit 310 in the bit line control circuit 2 of FIG. 2. Other sense latch circuits have configurations similar to that of the sense latch circuit 310.

Referring to FIG. 3, the sense latch circuit 310 includes a latch circuit 310a and switching transistors 310b to 310d.

One end of the transistor 310d is connected to a data storage terminal N of the latch circuit 310a. The other end of the transistor 310d is connected to the data input and output buffer 4.

The transistor 310c is connected between the other end of the transistor 310d and the bit line BL0.

The transistor 310b is connected between the other end of the transistor 310c and the bit line BL1.

The transistors 310c and 310d are controlled by bit line selection signals BTL0 and BTL1 output from the column decoder 3.

The latch circuit 310a includes an inverter 310a1 and an inverter 310a2. An input part of the inverter 310a1 is connected to the data storage terminal N. An input part of the inverter 310a2 is connected to an output part of the inverter 310a1, and an output part of the inverter 310a2 is connected to the data storage terminal N.

The column decoder 3 controls the transistors 310b to 310d to connect the data storage terminal N and the bit lines BL0 and BL1 or the data input and output buffer 4. This enables the data transfer between the latch circuit 310a and the bit lines BL0 and BL1 or the data input and output buffer 4. Thus, the latch circuit 310 temporarily retains the data connected to the memory cell through the bit line BL1.

Figure 4:
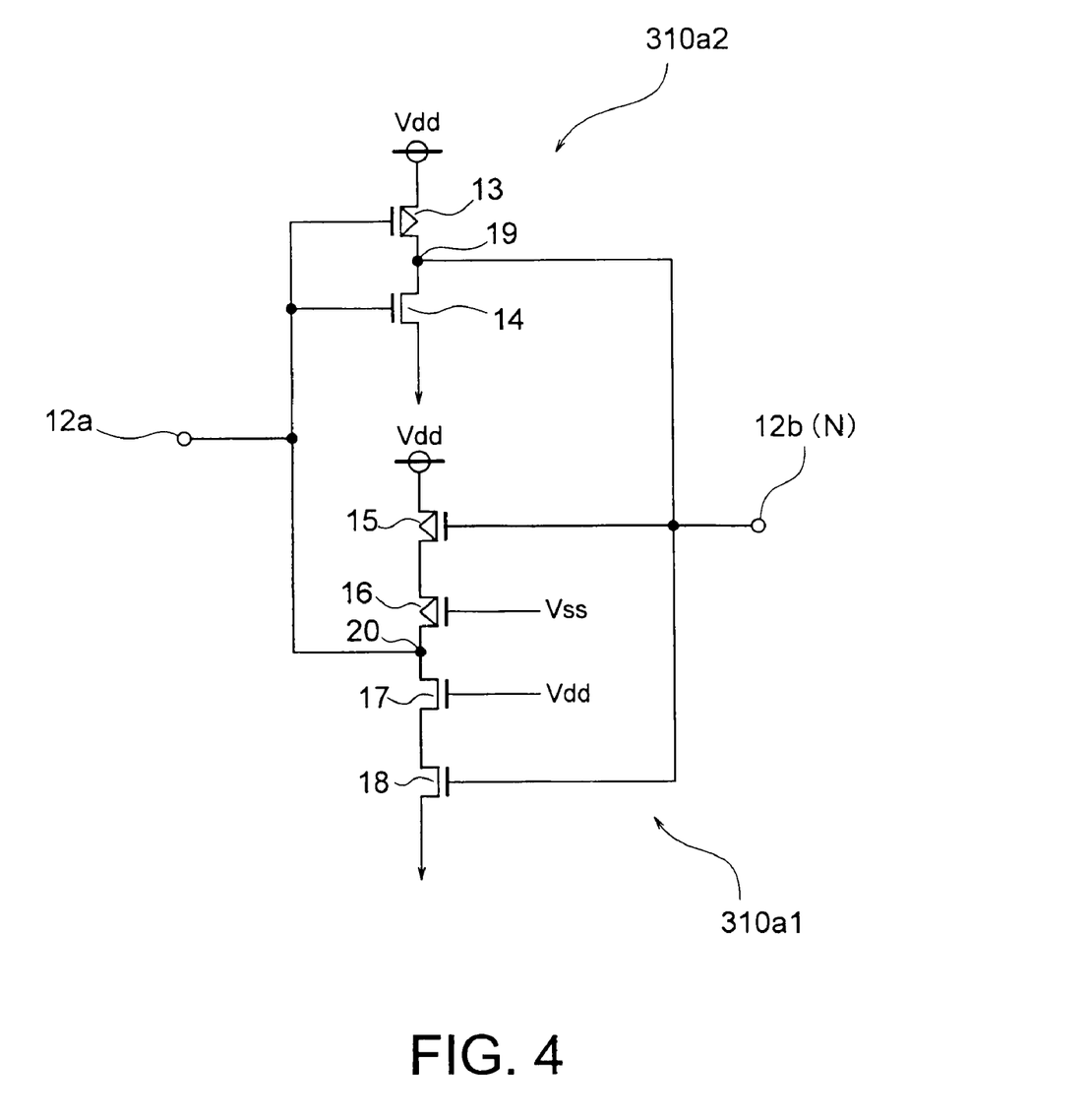
FIG. 4 is a circuit diagram illustrating an example of specific circuit configuration of the latch circuit 310a of FIG. 3.

FIG. 4 is a circuit diagram illustrating an example of specific circuit configuration of the latch circuit 310a of FIG. 3.

Referring to FIG. 4, the latch circuit 310a includes a first terminal 12a, a second terminal 12b, p-MOS transistors 13, 15, and 16, and n-MOS transistors 14, 17, and 18.

The first terminal 12a is connected to an input part of the inverter 310a2. As illustrated in FIG. 3, the second terminal 12b is connected to an input part (data storage terminal N) of the inverter 310a1.

The p-MOS transistor 13 and the n-MOS transistor 14 are connected in series between a power supply VDD and a ground. Gates of the p-MOS transistor 13 and n-MOS transistor 14 are connected to the first terminal 12a. A contact 19 located between the p-MOS transistor 13 and the n-MOS transistor 14 is connected to the second terminal 12b.

The p-MOS transistor 15, the p-MOS transistor 16, the n-MOS transistor 17, and the n-MOS transistor 18 are connected in series between the power supply VDD and the ground.

The gate of the p-MOS transistor 15 is connected to the output terminal 12b.

The gate of the n-MOS transistor 17 is connected to the power supply Vdd. This enables the n-MOS transistor 17 to become on state.

The gate of the p-MOS transistor 16 is connected to a ground Vss. This enables the p-MOS transistor 16 to become on state.

The gate of the n-MOS transistor 18 is connected to the second terminal 12b. Further, a contact 20 located between the p-MOS transistor 16 and the n-MOS transistor 17 is connected to the first terminal 12a.

Next, an off current in operating the latch circuit 310a having the above-described configuration will be described.

Figure 5A:
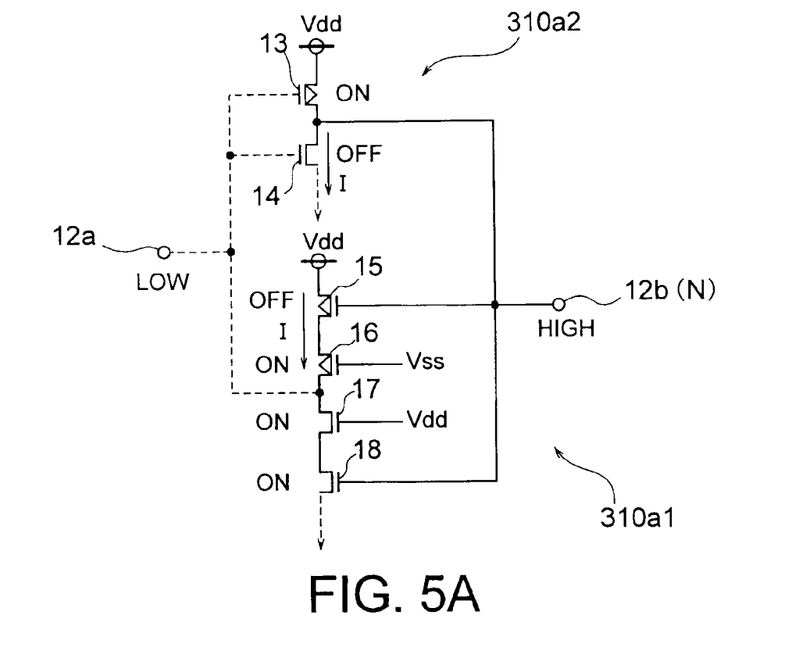
FIG. 5A is a view for explaining the off current in cases where the second terminal 12b (data storage terminal N) of FIG. 4 is at a "High" level.
Figure 5B:
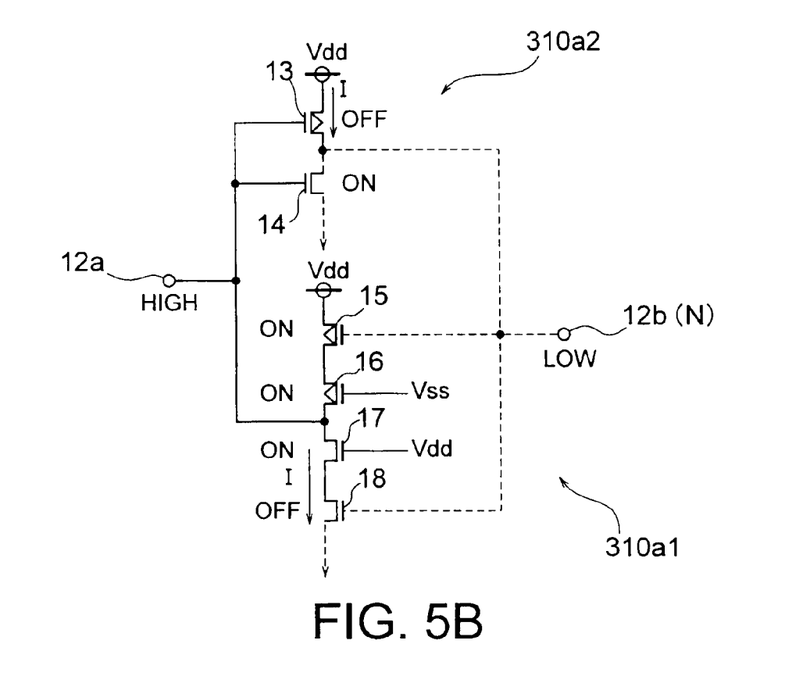
FIG. 5B is a view for explaining the off current in cases where the second terminal 12b (data storage terminal N) of FIG. 4 is at a "Low" level.

FIG. 5A is a view for explaining the off current in cases where the second terminal 12b (data storage terminal N) of FIG. 4 is at a "High" level. FIG. 5B is a view for explaining the off current in cases where the second terminal 12b (data storage terminal N) of FIG. 4 is at a "Low" level.

As illustrated in FIG. 5A, in cases where the second terminal 12b (data storage terminal N) is at the "High" level, an off current I is passed between the n-MOS transistor 14 and the p-MOS transistors 15 and 16.

As illustrated in FIG. 5B, in cases where the second terminal 12b (data storage terminal N) is at the "Low" level, the off current I is passed between the p-MOS transistor 13 and the n-MOS transistors 17 and 18.

As illustrated in FIGS. 5A and 5B, there are two data states of "0" and "1" that the latch circuit 310a retains at the data storage terminal N. In the latch circuit 310a, the off current whose voltage drops by a threshold voltage is passed through the series-connected transistors due to drain voltage dependence according to the two states.

For example, in the standby state, the logic retained in the latch circuit 310a is rewritten by one logic state having the smaller off current in the two logic states of "0" and "1". Therefore, the consumption current of the latch circuit 310a can be reduced.

Further, in the standby state, the logic of each latch circuit of the bit line control circuit 2 is controlled such that the off current is lowered. Therefore, the consumption current (standby current) of the whole of the NAND-type flash memory 100 can be reduced.

Next, an example of the operation that is performed to reduce the consumption current by the NAND-type flash memory 100 will be described. The description is made while attention is paid to the latch circuit 310*a* by way of example. The same holds true for other latch circuits.

Figure 6:
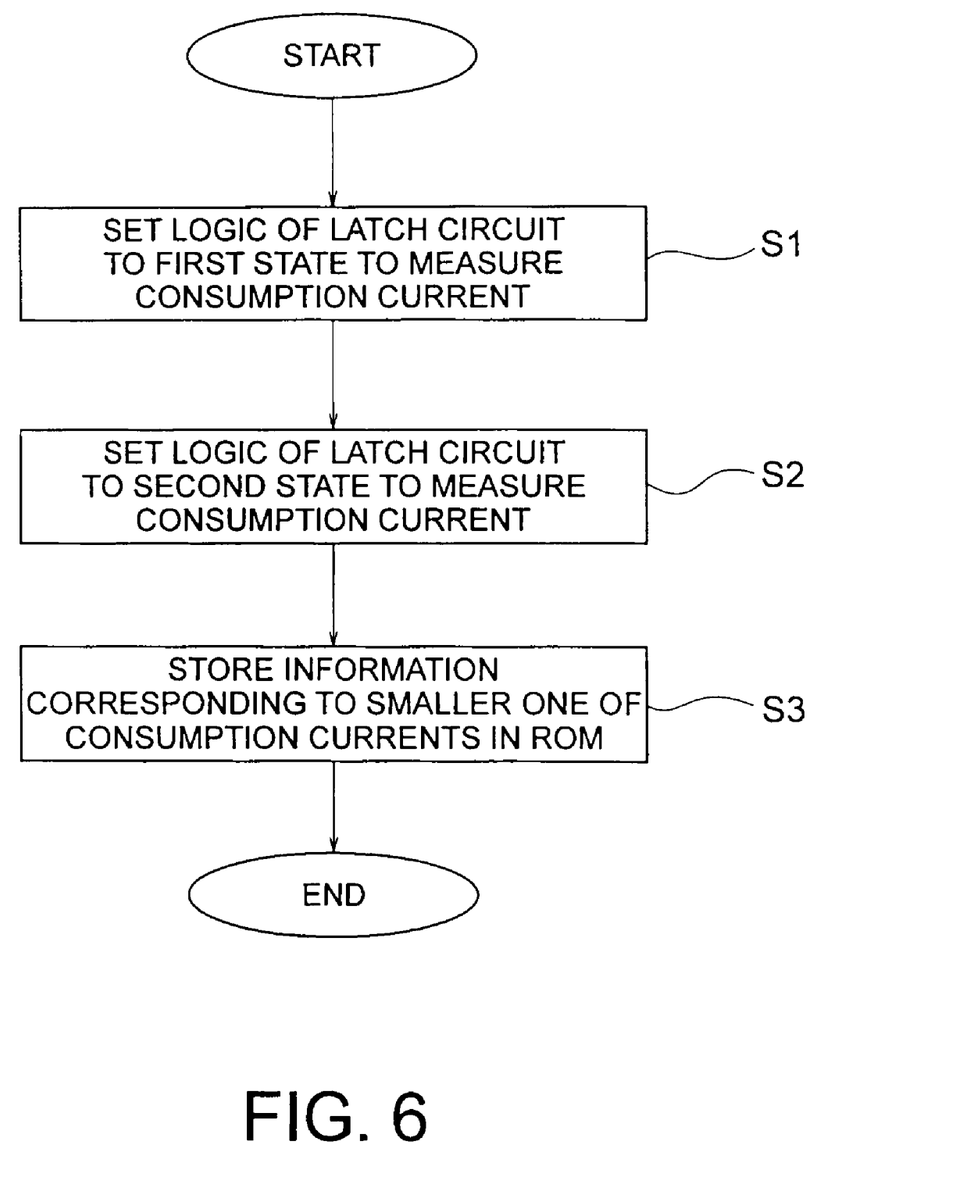
FIG. 6 is a flowchart illustrating an example of an operation in which the NAND-type flash memory 100 of the first embodiment obtains information corresponding to a state corresponding to a smaller one of the consumption currents.
Figure 7:
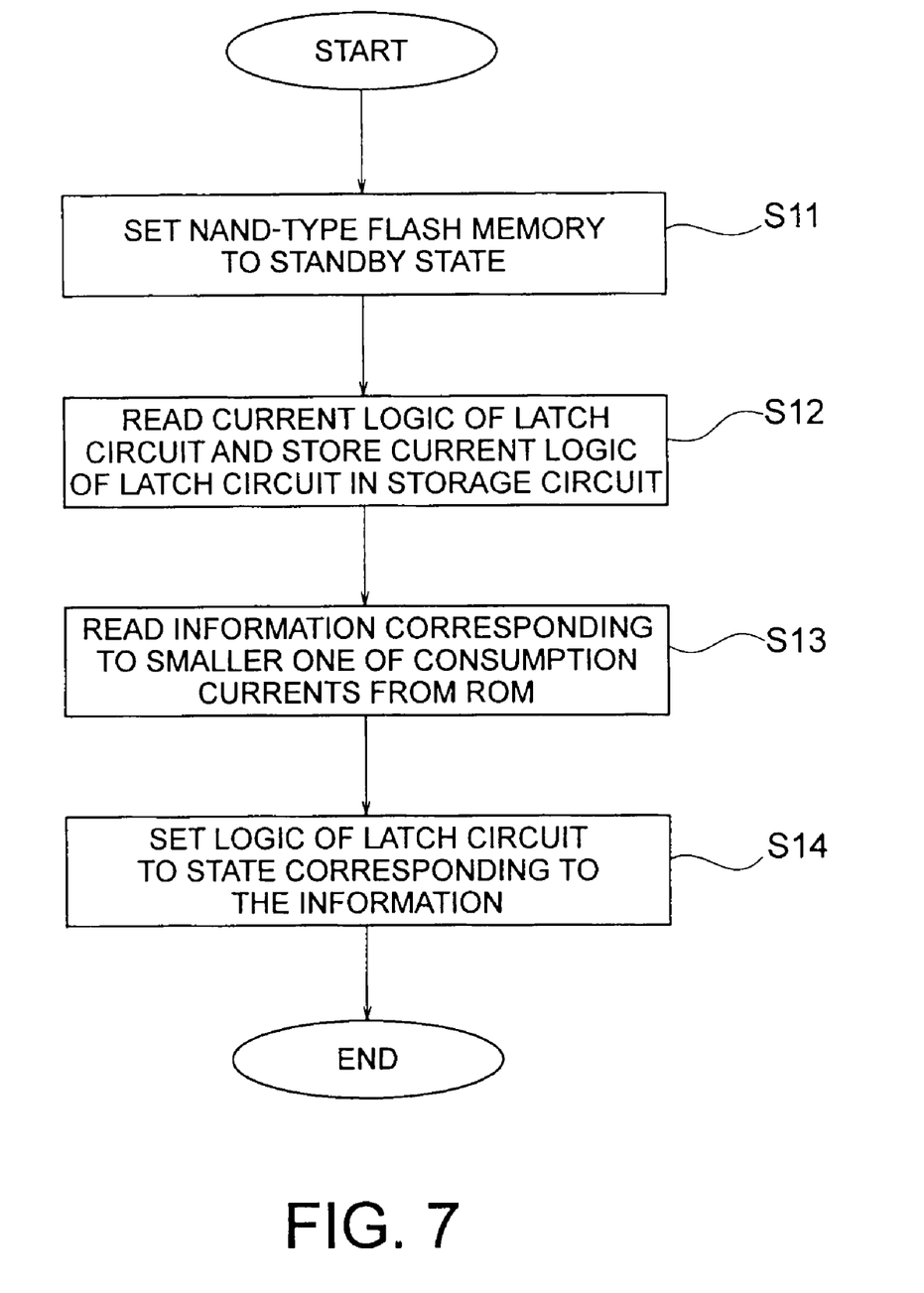
FIG. 7 is a flowchart illustrating an example of an operation in which the NAND-type flash memory 100 of the first embodiment puts the consumption current in the smaller state on standby.

FIG. 6 is a flowchart illustrating an example of an operation in which the NAND-type flash memory 100 of the first embodiment obtains information corresponding to a state corresponding to a smaller one of the consumption currents. FIG. 7 is a flowchart illustrating an example of an operation in which the NAND-type flash memory 100 of the first embodiment puts the consumption current in the smaller state on standby.

As illustrated in FIG. 6, in a first state in which the control circuit 7 causes the latch circuit 310*a* to retain first logic (in this case, "0"), for example, the test circuit 11 measures a first consumption current I1 of the latch circuit 310*a* (Step S1).

Then, in a second state in which the control circuit 7 causes the latch circuit 310*a* to retain second logic (in this case, "1") in which the first logic is inverted, the test circuit 11 measures a second consumption current I2 of the latch circuit (Step S2).

Next, the control circuit 7 compares the first consumption current I1 and second consumption current I2, measured by the test circuit 11, and the control circuit 7 stores the information corresponding to a state corresponding to a smaller one of the first consumption current I1 and second consumption current I2 in ROM 9 (Step S3). The information includes the logic (data) and consumption current value corresponding to a state corresponding to a smaller one of the first consumption current I1 and second consumption current I2.

According to the above flows, the NAND-type flash memory 100 obtains the information corresponding to a state corresponding to a smaller one of the consumption currents of the latch circuit 310*a*.

Then, for example, the write, erase, read operations are completed. In cases where the write, erase, read operations are not performed, the NAND-type flash memory 100 is in a standby state as illustrated in FIG. 7 (Step S11).

The control circuit 7 reads the logic (data) currently retained in the latch circuit 310*a*, and the control circuit 7 stores the logic in the storage circuit 10 (Step S12).

The control circuit 7 reads the information stored in Step S3 from ROM 9 (Step S13), and the control circuit 7 causes the latch circuit 310*a* to retain the logic corresponding to the information (Step S14)

According to the above flows, in the standby state, the NAND-type flash memory 100 can put the consumption current (standby current) in the smaller state.

In cases where the NAND-type flash memory 100 returns from the standby state, the data is read from the storage circuit 10, and the latch circuit 310*a* is caused to retain the data, which allows the NAND-type flash memory 100 to restore the logic retained in the latch circuit 310*a* to the original state.

Another example of the operation in which the NAND-type flash memory 100 reduces the consumption current will be described below.

Figure 8:
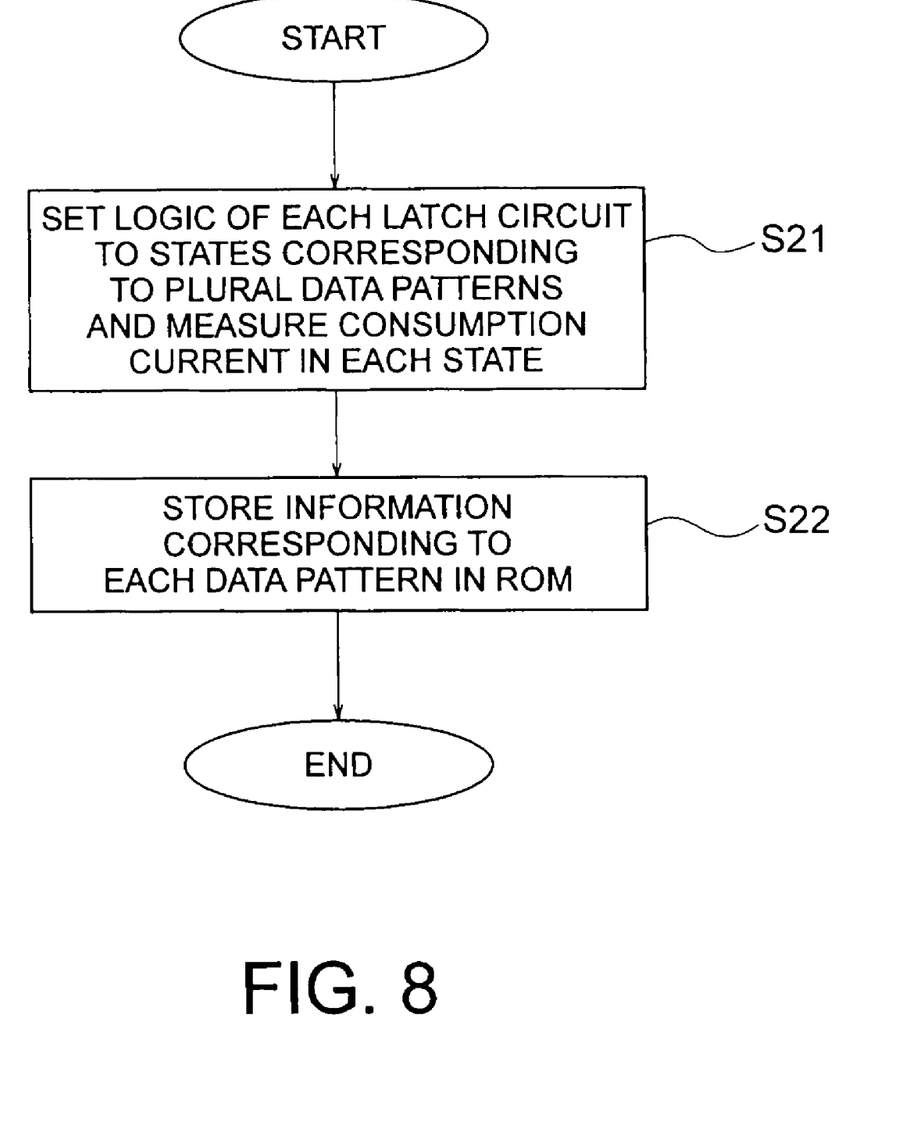
FIG. 8 is a flowchart illustrating another example of the operation in which the NAND-type flash memory 100 of the first embodiment obtains information corresponding to a state corresponding to a smaller one of consumption currents.
Figure 9:
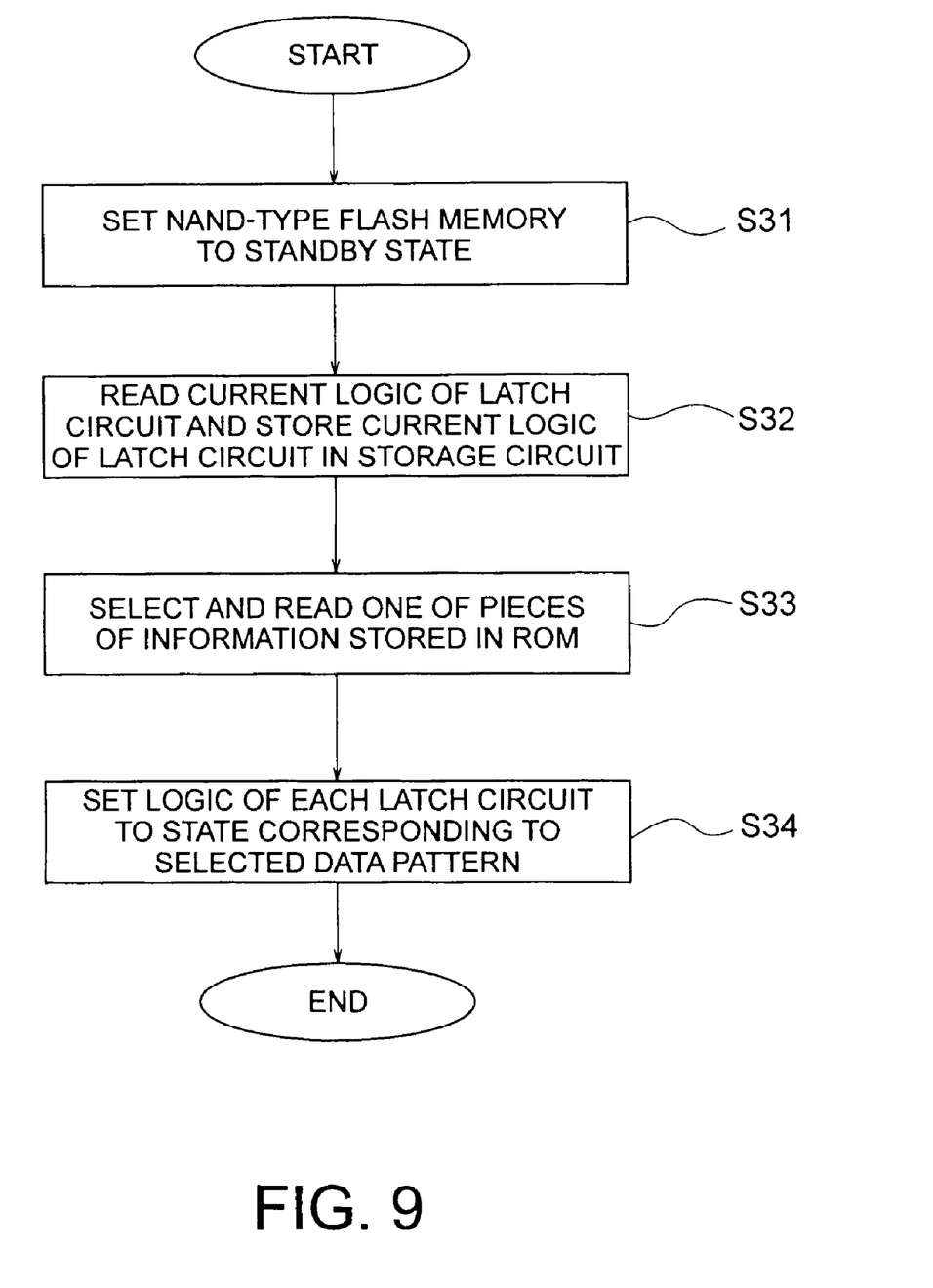
FIG. 9 is a flowchart illustrating another example of the operation in which the NAND-type flash memory 100 of the first embodiment puts the consumption current in the smaller state on standby.

FIG. 8 is a flowchart illustrating another example of the operation in which the NAND-type flash memory 100 of the first embodiment obtains information corresponding to a state corresponding to a smaller one of the consumption currents. FIG. 9 is a flowchart illustrating another example of the operation in which the NAND-type flash memory 100 of the first embodiment puts the consumption current in the smaller state on standby.

As illustrated in FIG. 8, the logic of each latch circuit is caused to correspond to plural different data patterns, and the consumption current is measured in each state (Step S21).

For example, in the first state in which the control circuit 7 causes the plural latch circuits of the bit line control circuit 2 to retain respectively the logic corresponding to a first data pattern, the test circuit 11 measures the first consumption currents I1 of all the plural latch circuits. Similarly, in the second state in which the control circuit 7 causes the plural latch circuits of the bit line control circuit 2 to retain the logic corresponding to a second data pattern that is different from the first data pattern, the test circuit 11 measures the second consumption currents I2 of all the plural latch circuits.

Alternatively, the test circuit 11 may measure the consumption current of the NAND-type flash memory 100 instead of the measurement of the consumption currents of all the plural latch circuits.

Then, the control circuit 7 stores the information corresponding to each data pattern in ROM 9 (Step S22). The information includes the data pattern and the consumption current value.

That is, for example, the information corresponding to the data pattern in the state of the first consumption currents I1 of all the plural latch circuits measured in the first state in which the plural latch circuits are caused to retain the logic corresponding to the first data pattern and the information corresponding to the data pattern in the state of the second consumption currents I2 of all the plural latch circuits measured in the second state in which the plural latch circuits are caused to retain the logic corresponding to the second data pattern are stored in ROM 9.

According to the above flows, the NAND-type flash memory 100 obtains the pieces of information corresponding to the consumption current and state of all the plural latch circuits (or the NAND-type flash memory 100).

Then, for example, the write, erase, read operations are completed. In cases where the write, erase, read operations are not performed, the NAND-type flash memory 100 is in the standby state as illustrated in FIG. 9 (Step S31).

The control circuit 7 reads the pieces of logic (data) currently retained in the plural latch circuits, and the control circuit 7 stores the pieces of logic in the storage circuit 10 (Step S32).

The control circuit 7 selects one of the pieces of information stored in Step S22, and the control circuit 7 reads the information from ROM 9 (Step S33). The control circuit 7 causes the plural latch circuits to retain the logic corresponding to the data pattern corresponding to the information (Step S34).

According to the above flows, in the standby state, the NAND-type flash memory 100 can put the consumption current (standby current) in the smaller state.

In cases where the NAND-type flash memory 100 returns from the standby state, the data is read from the storage circuit 10, and the plural latch circuits are caused to retain the data, which allows the NAND-type flash memory 100 to restore the pieces of logic retained in the plural latch circuits to the original state.

Figure 10:
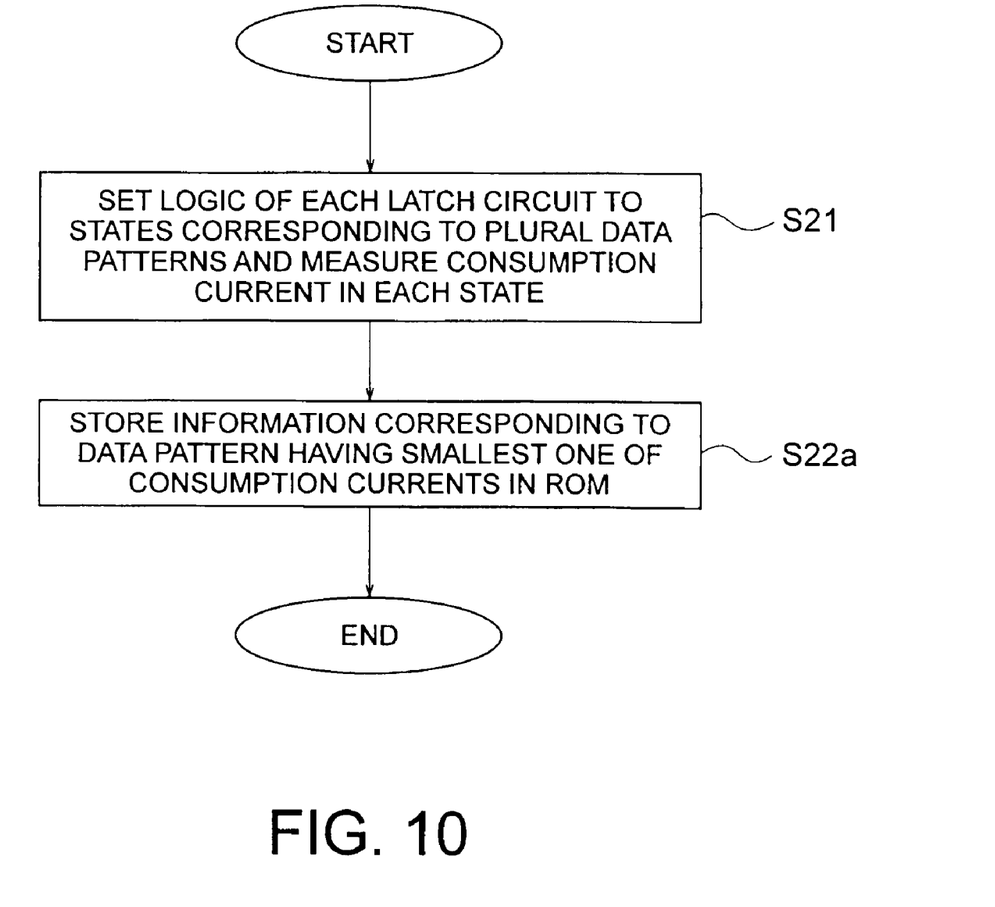
FIG. 10 is a flowchart illustrating still another example of the operation in which the NAND-type flash memory 100 of the first embodiment obtains the information corresponding to a state corresponding to a smaller one of the consumption currents.
Figure 11:
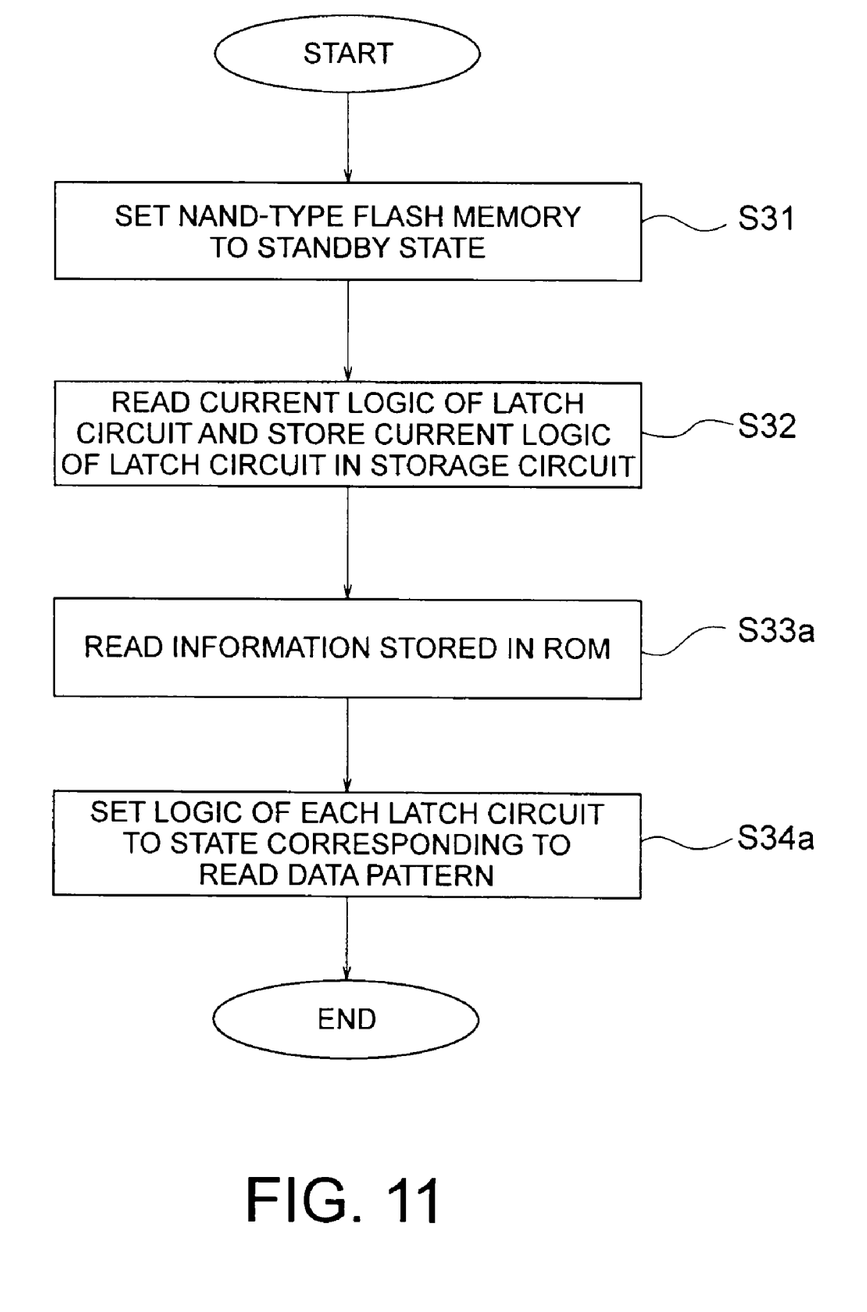
FIG. 11 is a flowchart illustrating still another example of the operation in which the NAND-type flash memory 100 of the first embodiment puts the consumption current in the smaller state on standby.

Still another example of the operation in which the NAND-type flash memory 100 reduces the consumption current will be described below FIG. 10 is a flowchart illustrating still another example of the operation in which the NAND-type flash memory 100 of the first embodiment obtains the information corresponding to a state corresponding to a smaller one of the consumption currents. A process in Step S21 of FIG. 10 is similar to that in Step S21 of FIG. 8. FIG. 11 is a flowchart illustrating still another example of the operation in which the NAND-type flash memory 100 of the first embodiment puts the consumption current in the smaller state on standby. Processes in Step S31 and S32 of FIG. 11 are similar to those in Step S31 and S32 of FIG. 9.

As illustrated in FIG. 10, the logic of each latch circuit is caused to correspond to plural different data patterns, and the consumption current is measured in each state (Step S21).

For example, in the first state in which the control circuit 7 causes the plural latch circuits of the bit line control circuit 2 to retain the logic corresponding to a first data pattern, the test circuit 11 measures the first consumption currents I1 of all the plural latch circuits. Similarly, in the second state in which the control circuit 7 causes the plural latch circuits of the bit line control circuit 2 to retain the logic corresponding to a second data pattern that is different from the first data pattern, the test circuit 11 measures the second consumption currents I2 of all the plural latch circuits.

Alternatively, the test circuit 11 may measure the consumption current of the NAND-type flash memory 100 instead of the measurement of the consumption currents of all the plural latch circuits.

Then, the control circuit 7 compares the consumption currents in the states, and the control circuit 7 stores the information corresponding to the data pattern corresponding to the smallest one of the consumption current values in ROM 9 (Step S22a). The information includes the data pattern and the consumption current value.

That is, for example, the information corresponding to the data pattern corresponding to a smaller one of the first consumption currents I1 of all the plural latch circuits measured in the first state in which the plural latch circuits are caused to retain the logic corresponding to the first data pattern and the second consumption currents I2 of all the plural latch circuits measured in the second state in which the plural latch circuits are caused to retain the logic corresponding to the second data pattern that is different from the first data pattern is stored in ROM 9.

According to the above flows, the NAND-type flash memory 100 obtains the pieces of information corresponding to the consumption current and state of all the plural latch circuits (or the NAND-type flash memory 100).

Then, for example, the write, erase, read operations are completed. In cases where the write, erase, read operations are not performed, the NAND-type flash memory 100 is in the standby state as illustrated in FIG. 11 (Step S31).

The control circuit 7 reads the pieces of logic (data) currently retained in the plural latch circuits, and the control circuit 7 stores the pieces of logic in the storage circuit 10 (Step S32).

The control circuit 7 reads out the information stored in Step S22a from ROM 9 (Step S33a), and the control circuit 7 causes the plural latch circuits to retain the logic corresponding to the data pattern corresponding to the information (Step S34a).

According to the above flows, in the standby state, the NAND-type flash memory 100 can put the consumption current (standby current) in the smaller state.

In cases where the NAND-type flash memory 100 returns from the standby state, the data is read from the storage circuit 10, and the plural latch circuits are caused to retain the data, which allows the NAND-type flash memory 100 to restore the pieces of logic retained in the plural latch circuits to the original state.

As described above, in the NAND-type flash memory according to the first embodiment, the consumption current can be reduced.

In the first embodiment, the control circuit compares the magnitudes of the consumption currents. Alternatively, the test circuit compares the magnitudes of the consumption currents.

What is claimed is:

1. A NAND-type flash memory comprising:
   a memory cell array in which memory cells are arrayed in a matrix state;
   a bit line control circuit that includes a plurality of transistors and a plurality of latch circuits, each of the plurality of latch circuits being connected to memory cells through a bit line and to one of the plurality of transistors; and
   a column decoder,
   wherein, in a standby state where a read operation is not performed, the plurality of latch circuits stores logic corresponding to one of "0" and "1".

2. The NAND-type flash memory according to claim 1, wherein A gate of the one of the plurality of transistors connects to the column decoder.

3. The NAND-type flash memory according to claim 2, wherein the column decoder turns one of the plurality of transistors off in the standby state.

4. The NAND-type flash memory according to claim 2, wherein the plurality of latch circuits stores logic corresponding to a smaller one of consumption currents of the latch circuit corresponding to one of "0" and "1".

5. The NAND-type flash memory according to claim 1, wherein the plurality of latch circuits stores logic corresponding to a smaller one of consumption currents of the latch circuit corresponding to one of "0" and "1".

6. The NAND-type flash memory according to claim 5, wherein the consumption currents are measured by a test circuit.

7. The NAND-type flash memory according to claim 6, further comprising a nonvolatile memory,
   wherein logic corresponding to a smaller one of the consumption currents of the latch circuit corresponding to one of "0" and "1" is stored in the nonvolatile memory.

8. The NAND-type flash memory according to claim 1,
   wherein a consumption current of the plurality of latch circuits is measured in a first state in which the plurality of latch circuits latch a first data pattern including "0" and "1",
   a leakage current of the plurality of latch circuits is measured in a second state in which the plurality of latch circuits latch a second data pattern including "0" and "1" that is different from the first data pattern, and
   the plurality of latch circuit stores a state corresponding to a smaller one of a consumption current of the latch circuit corresponding to one of the first state and the second state.

9. The NAND-type flash memory according to claim 8, wherein the consumption current is measured by a test circuit.

10. The NAND-type flash memory according to claim 9, further comprising a nonvolatile memory,
    wherein one of the first state and the second state corresponding to a smaller one of the consumption currents is stored in the nonvolatile memory.

11. The NAND-type flash memory according to claim 1, wherein, in the standby state, write and erase operations are not performed.

* * * * *